(12) United States Patent
Hagihara et al.

(10) Patent No.: US 10,753,972 B2
(45) Date of Patent: Aug. 25, 2020

(54) WAFER INSPECTION SYSTEM, WAFER INSPECTION APPARATUS AND PROBER

(71) Applicant: Tokyo Electron Limited, Tokyo (JP)

(72) Inventors: Junichi Hagihara, Nirasaki (JP);
Shigekazu Komatsu, Nirasaki (JP);
Kunihiro Furuya, Nirasaki (JP);
Tadayoshi Hosaka, Nirasaki (JP);
Naoki Muramatsu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 297 days.

(21) Appl. No.: 15/582,848

(22) Filed: May 1, 2017

(65) Prior Publication Data
US 2017/0234924 A1    Aug. 17, 2017

Related U.S. Application Data

(63) Continuation of application No. 14/525,431, filed on Oct. 28, 2014, now Pat. No. 9,671,459.

(30) Foreign Application Priority Data

Oct. 29, 2013  (JP) ................. 2013-224460

(51) Int. Cl.
*G01R 31/28* (2006.01)
*G01R 1/04* (2006.01)
*H01L 21/677* (2006.01)
*H01L 21/687* (2006.01)

(52) U.S. Cl.
CPC ....... *G01R 31/2893* (2013.01); *G01R 1/0491* (2013.01); *H01L 21/67706* (2013.01); *H01L 21/67724* (2013.01); *H01L 21/67769* (2013.01); *H01L 21/68742* (2013.01)

(58) Field of Classification Search
CPC .................. G01R 1/07307; G01R 1/07342
See application file for complete search history.

(56) References Cited

U.S. PATENT DOCUMENTS

| 5,506,512 | A | 4/1996 | Tozawa et al. |
| 7,586,317 | B2 | 9/2009 | Komatsu et al. |
| 2005/0277323 | A1 | 12/2005 | Eldridge et al. |
| 2008/0169831 | A1 | 7/2008 | Lu et al. |
| 2009/0021272 | A1 | 1/2009 | Komatsu |

(Continued)

FOREIGN PATENT DOCUMENTS

| CN | 101349736 A | 1/2009 |
| CN | 102066962 A | 5/2011 |

(Continued)

*Primary Examiner* — Tung X Nguyen
(74) *Attorney, Agent, or Firm* — Pearne & Gordon LLP (57) ABSTRACT

A wafer inspection system is provided. The wafer inspection system comprises: a transfer region in which a transfer device is arranged; an inspection region in which test heads for inspecting a substrate are arranged; and a maintenance region in which the test heads are maintained. The inspection region is located between the transfer region and the maintenance region, a plurality of inspection rooms accommodating the test heads are adjacent to each other in the inspection region, and the test heads are configured to be unloaded from the inspection region to the maintenance region.

7 Claims, 7 Drawing Sheets

(56) References Cited

U.S. PATENT DOCUMENTS

| | | | |
|---|---|---|---|
| 2010/0148793 A1* | 6/2010 | Ito | G01R 31/31718 324/537 |
| 2010/0156434 A1 | 6/2010 | Okino | |
| 2010/0301889 A1* | 12/2010 | Sakata | G01R 31/2889 324/756.07 |
| 2011/0156733 A1 | 6/2011 | Yano | |
| 2011/0298630 A1 | 12/2011 | Kiyokawa et al. | |
| 2017/0146595 A1* | 5/2017 | Tamura | G01R 31/2891 |

FOREIGN PATENT DOCUMENTS

| | | |
|---|---|---|
| JP | S63-114229 A | 5/1988 |
| JP | H03-63577 A | 3/1991 |
| JP | 05-175290 A | 7/1993 |
| JP | 08-064645 A | 3/1996 |
| JP | 08-335614 A | 12/1996 |
| JP | H09-148388 A | 6/1997 |
| JP | 2003-160299 A | 6/2003 |
| JP | 2004-170267 A | 6/2004 |
| JP | 2009-503854 A | 1/2009 |
| JP | 2010-074091 A | 4/2010 |
| JP | 2010-157550 A | 7/2010 |
| JP | 2011-038906 A | 2/2011 |
| JP | 2012-063227 A | 3/2012 |
| JP | 2013-156084 A | 8/2013 |
| JP | 2014-150168 A | 8/2014 |
| WO | 2007/015952 A2 | 2/2007 |
| WO | 2009/004968 A1 | 1/2009 |
| WO | 2011/016096 A1 | 2/2011 |

* cited by examiner

WAFER INSPECTION SYSTEM, WAFER INSPECTION APPARATUS AND PROBER

CROSS-REFERENCE TO RELATED APPLICATION

This is a divisional application of U.S. patent application Ser. No. 14/525,431, filed on Oct. 28, 2014 which claims the benefit of Japanese Patent Application No. 2013-224460 filed on Oct. 29, 2013, the entire disclosures of which are incorporated herein by reference.

TECHNICAL FIELD

The embodiments described herein pertain generally to a wafer inspection system, a wafer inspection apparatus and a prober.

BACKGROUND

There has been used a prober as a wafer inspection apparatus to perform an electrical characteristic test on each of multiple semiconductor devices formed on a semiconductor wafer (hereinafter, simply referred to as "wafer"). The prober includes a probe card facing the wafer, and the probe card includes multiple contact probes as a multiple number of column-shaped contact terminals (see, for example, Patent Document 1). In this prober, a test signal is outputted to a semiconductor device connected to an electrode pad or a solder bump through each of the contact probes of the probe card, so that a conducting state of an electrical circuit of the semiconductor devices can be inspected.

A test signal is sent to each of the contact probes of the probe card from a test head having a main board as a test circuit. Recently, in order to improve wafer test efficiency, there has been developed a wafer inspection apparatus which includes multiple test heads each having a probe card and inspects a semiconductor device of a wafer with a single test head while the wafer is transferred to another test head. In this wafer inspection apparatus, from the viewpoint of reduction in footprint, cells each accommodating multiple test heads are stacked at multiple levels.

Since a main board of each test head is a kind of consumables, the main board needs to be regularly replaced. In order to replace the main board, the test head needs to be unloaded from the wafer inspection apparatus to above a maintenance carriage.

Patent Document 1: Japanese Patent Laid-open Publication No. 2012-063227

However, the test head has a weight of about 70 kgf and is supported by a slide rail. Thus, it is difficult to move the test head in other directions than in an unloading direction. Therefore, it is necessary to correctly adjust a position of the maintenance carriage to a position of the test head. However, since the maintenance carriage includes a lift device or the like and has a high weight, it is difficult to fine control the position thereof. As a result, it is difficult to unload the test head.

SUMMARY

In view of the foregoing, example embodiments provide a maintenance carriage for a wafer inspection apparatus capable of easily unloading a test head and a maintenance method for the wafer inspection apparatus.

In one example embodiment, a wafer inspection system is provided. The wafer inspection system comprises: a transfer region in which a transfer device is arranged; an inspection region in which test heads for inspecting a substrate are arranged; and a maintenance region in which the test heads are maintained. The inspection region is located between the transfer region and the maintenance region, a plurality of inspection rooms accommodating the test heads are adjacent to each other in the inspection region, and the test heads are configured to be unloaded from the inspection region to the maintenance region.

A maintenance carriage which is movable and is configured to support the unloaded test heads may be arranged in the maintenance region. The maintenance carriage may be configured to accommodate the test heads and has a case which is movable up and down, and the case may be allowed to directly face one of the inspection rooms by moving the maintenance carriage and by moving the case up and down.

A position of the maintenance carriage and a position of the case may be configured to be fixed. A guide rail configured to control a moving direction of the maintenance carriage may be arranged in the inspection region. Each of the plurality of inspection rooms may have an opening facing the maintenance region, and each of the test heads may be configured to be unloaded to the maintenance region via the opening.

In another example embodiment, a wafer inspection apparatus is provided. The wafer inspection apparatus comprises: a plurality of inspection rooms comprising test heads to be maintained for inspecting a substrate on which a semiconductor device is formed and a guide rail for unloading the test heads to be maintained to a maintenance region; and a loader configured to transfer the substrate into one of the inspection rooms. The plurality of inspection rooms are arranged at a cell tower between the loader and the maintenance region, and the loader and the maintenance region are arranged at opposite sides of the cell tower.

In another example embodiment, a wafer inspection apparatus is provided. The wafer inspection apparatus comprises: a plurality of inspection rooms comprising test heads to be maintained for inspecting a substrate on which a semiconductor device is formed and a slide rail for unloading the test heads to be maintained to a maintenance region; and a loader configured to transfer the substrate into one of the inspection rooms. The plurality of inspection rooms are arranged at a cell tower between the loader and the maintenance region, and the loader and the maintenance region are arranged at opposite sides of the cell tower.

In another example embodiment, a wafer inspection apparatus is provided. The wafer inspection apparatus comprises: a plurality of inspection rooms comprising test heads to be maintained for inspecting a substrate on which a semiconductor device is formed and a slide rail for unloading the test heads to be maintained to a maintenance region; and a loader configured to transfer the substrate into one of the inspection rooms. The plurality of inspection rooms are arranged between the loader and the maintenance region, and the loader and the maintenance region are facing to each other across the plurality of inspection rooms.

In accordance with the example embodiments, after a position of the carriage base is fixed and the case is moved up to a position of the test head to be maintained to be fixed, the position of the case can be fine controlled in the horizontal direction. Therefore, the case can directly face the test head to be maintained. As a result, it is possible to easily unload the test head toward the case.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A and FIG. 2B show components included in each cell of a cell tower of FIG. 1, and to be specific.

FIG. 3A and FIG. 3B schematically illustrate a configuration of the maintenance carriage in accordance with the present example embodiment, and to be specific.

FIG. 4A and FIG. 4B schematically illustrate configurations of a lifter and a test head case of FIG. 3A and FIG. 3B, and to be specific.

FIG. 6A and FIG. 6B are side views schematically illustrating a configuration of a simple maintenance carriage, and to be specific.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A maintenance carriage for a wafer inspection apparatus in accordance with the present example embodiment will be explained first.

Figure 1:
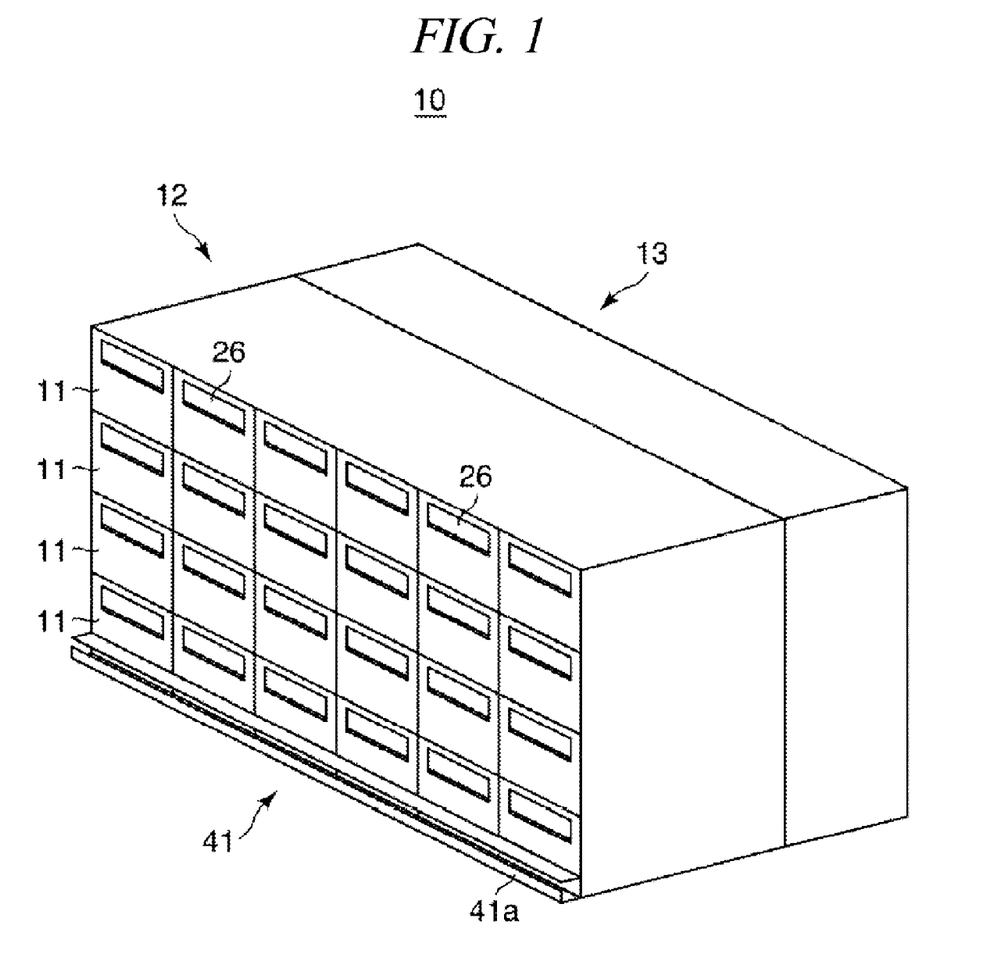
FIG. 1 is a perspective view schematically showing a configuration of a wafer inspection apparatus to which a maintenance carriage is applied in accordance with an example embodiment.

FIG. 1 is a perspective view schematically showing a configuration of a wafer inspection apparatus to which a maintenance carriage is applied in accordance with the example embodiment.

A wafer inspection apparatus 10 of FIG. 1 includes a cell tower 12 in which multiple inspection rooms (cells) 11 are arranged at multiple levels, for example, at four levels; and a loader 13 which is arranged to be adjacent to the cell tower 12 and configured to load and unload wafers with respect to respective cells 11 with a transfer device (not illustrated) provided therein. Each of the cell tower 12 and the loader 13 has a rectangular parallelepiped having a height of, for example, 2.4 m.

In the wafer inspection apparatus 10, at an opposite side (hereinafter, referred to as "outside") to a surface of the cell tower 12 adjacent to the loader 13, a space available for maintenance of each cell 11 by an operator is secured, and a maintenance carriage 27 to be described later is arranged therein.

Figure 2A:
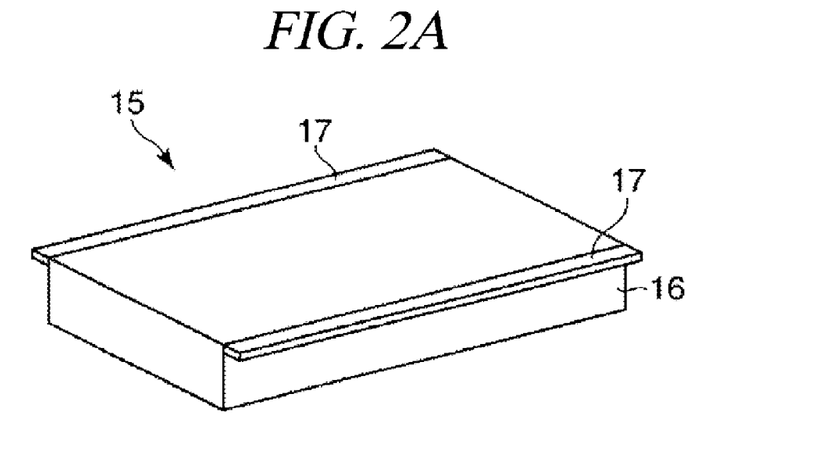
FIG. 2A is a perspective view of a test head.
Figure 2B:
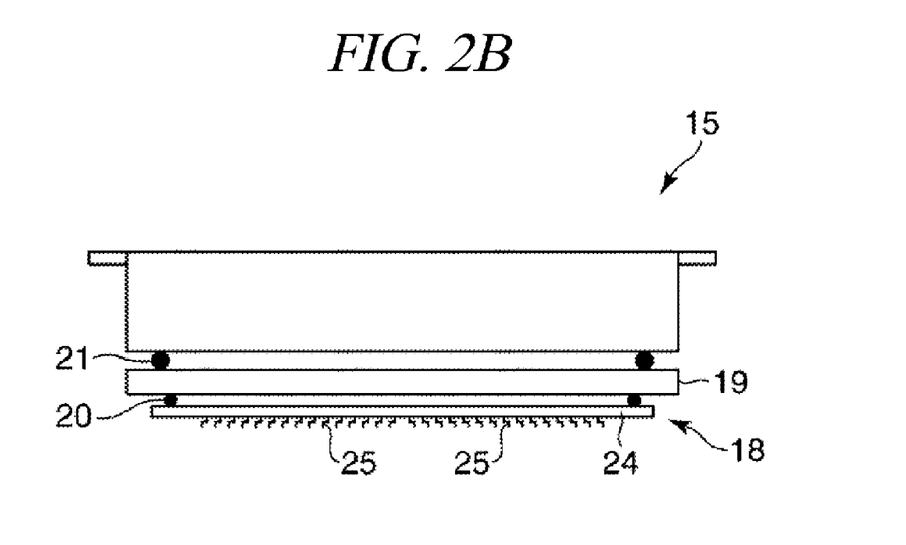
FIG. 2B is a front view illustrating an arrangement of the test head, a pogo frame, and a probe card in each cell.

FIG. 2A and FIG. 2B show components included in each cell of the cell tower of FIG. 1, and to be specific, FIG. 2A is a perspective view of a test head, and FIG. 2B is a front view illustrating an arrangement of the test head, a pogo frame, and a probe card in each cell.

A test head 15 depicted in FIG. 2A includes a main body 16 formed of a rectangular parallelepiped housing and a flange 17 protruding from an upper portion of a side surface of the main body 16 in a longitudinal direction thereof toward the side direction thereof. The main body 16 accommodates a main board (not illustrated) as a test circuit.

Further, as depicted in FIG. 2B, in each cell 11, the test head 15, a probe card 18, and a pogo frame 19 configured to support a pogo pin (not illustrated) electrically connecting the probe card 18 and the main board are provided. Sealing members 20 and 21 are arranged between the probe card 18 and the pogo frame 19 and between the pogo frame 19 and the test head 15, respectively. Since spaces surrounded by the sealing members 20 and 21 are depressurized, the probe card 18 and the pogo frame 19 are vacuum-attracted and attached to the test head 15.

The probe card 18 includes a circular plate-shaped main body 24 and multiple contact probes 25 as a multiple number of column-shaped contact terminals arranged to protrude from a lower surface of the main body 24 toward a lower side in the drawing. When a wafer (not illustrated) is brought into contact with the probe card 18, each of the contact probes 25 is brought into contact with an electrode pad or a solder bump (not illustrated) of each semiconductor device formed on the wafer.

Returning back to FIG. 1, a maintenance opening 26 is formed the outside of each cell 11, and the test head 15 is unloaded through this maintenance opening 26. The operator may unload a used main board from the unloaded test head 15 and provide a new main board to the test head 15.

Since the test head 15 has a weight of about 70 kgf, it is difficult for the operator alone to handle the test head 15. Therefore, the test head 15 is supported via the flange 17 by a slide rail (not illustrated) provided along a longitudinal direction of the test head 15 (hereinafter, simply referred to as "longitudinal direction") within the cell 11 and unloaded in the longitudinal direction by multiple balls provided on an upper surface of the slide rail.

In order for the operator to easily replace a main board in the wafer inspection apparatus 10, a supporting device to support the unloaded test head 15 is needed. Therefore, as the supporting device, the maintenance carriage 27 to be described below is provided in the present example embodiment.

Figure 3A:
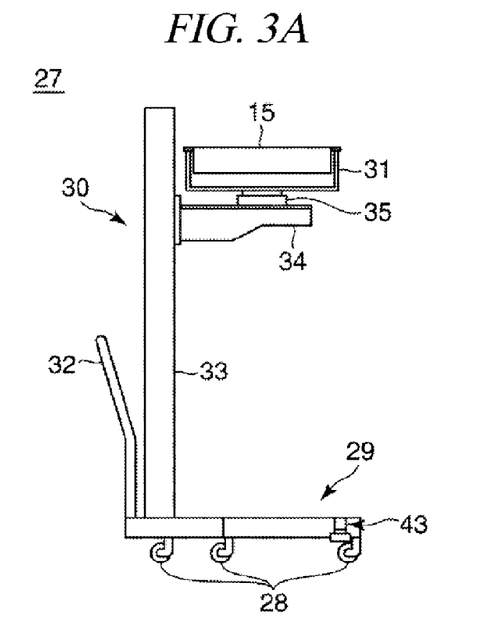
FIG. 3A is a side view thereof.
Figure 3B:
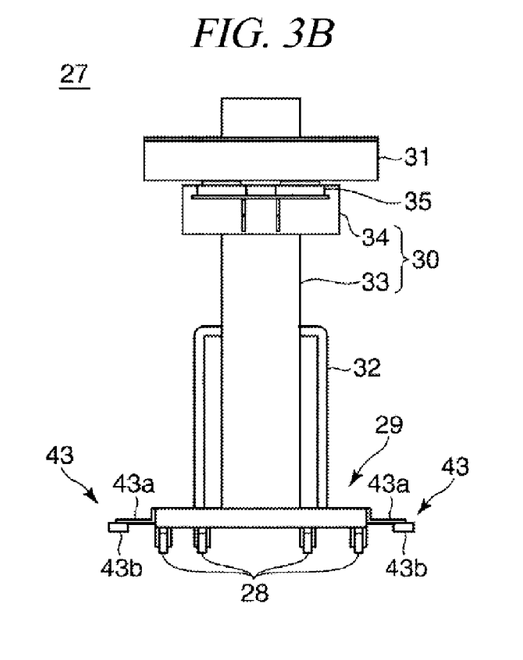
FIG. 3B is a front view thereof.

FIG. 3A and FIG. 3B are provided to schematically illustrate a configuration of the maintenance carriage in accordance with the present example embodiment, and to be specific, FIG. 3A is a side view thereof, and FIG. 3B is a front view thereof.

The maintenance carriage 27 depicted in FIG. 3A and FIG. 3B includes a carriage base 29 configured to be supported and moved by multiple rollers 28 (wheels); a lift device 30 provided uprightly from the carriage base 29; and a test head case 31 (case) that has a housing shape and accommodates the test head 15.

The carriage base 29 is provided with a handle 32, and the operator can move the maintenance carriage 27 by pushing or pulling the handle 32. Each roller 28 is formed of a pair of wheels and configured to readily change a direction, so that it is possible to improve the degree of freedom of movement of the maintenance carriage 27.

The lift device 30 includes a supporting column 33 extending from the carriage base 29 toward an upper side in the drawing; a lifter 34 provided at the supporting column 33 and configured to move along an extension direction of the supporting column 33, i.e., in the vertical direction in the drawing; and a motor (not illustrated) configured to move the lifter 34.

Further, each roller 28 of the carriage base 29 includes brake (not illustrated), and this brake is unlocked only when the lifter 34 is positioned at the lowermost position in the vertical direction.

Figure 4A:
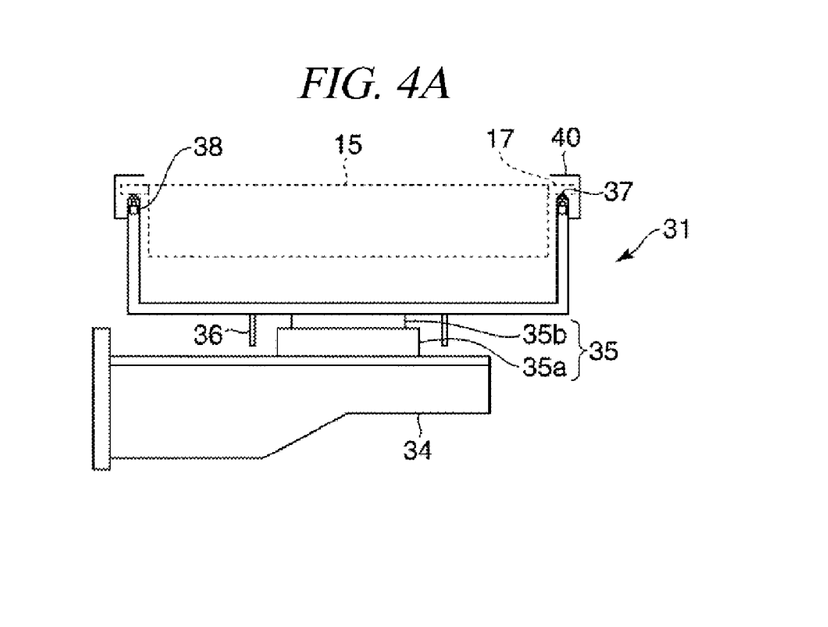
FIG. 4A is a side view thereof.
Figure 4B:
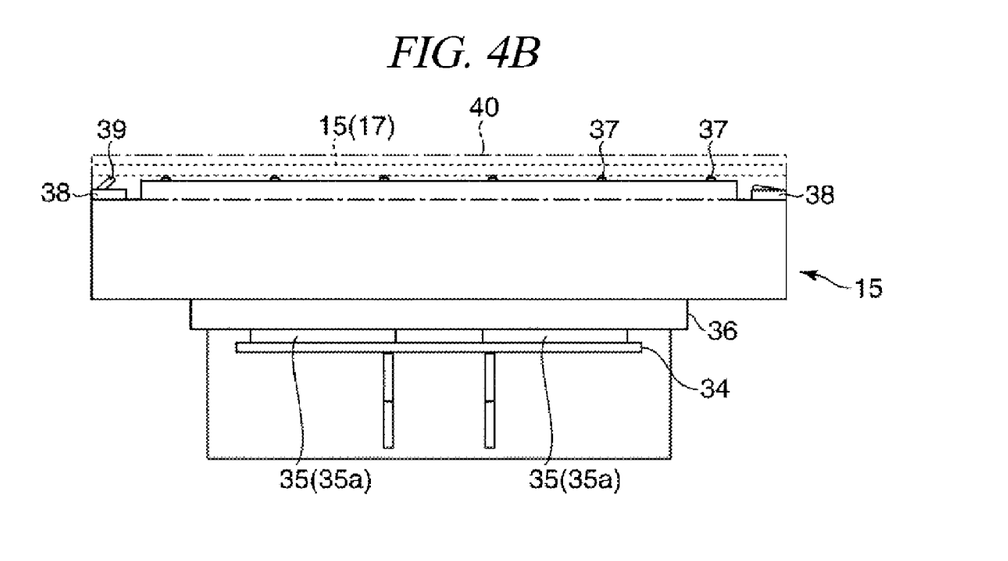
FIG. 4B is a front view thereof.

FIG. 4A and FIG. 4B schematically illustrate configurations of the lifter and the test head case of FIG. 3A and FIG. 3B, and to be specific, FIG. 4A is a side view thereof, and FIG. 4B is a front view thereof. For simple explanation, in FIG. 4A and FIG. 4B, the test head 15 is indicated by dashed lines, and in FIG. 4B, a slide rail cover 40 to be described later is indicated with a dashed dotted line and the slide rail cover 40 is illustrated in a see-through view.

As depicted in FIG. 4A and FIG. 4B, the test head case 31 has a rectangular parallelepiped shape, and both ends of the test head case 31 in a longitudinal direction are opened. When the test head 15 is unloaded from the cell 11, any one of the openings faces the maintenance opening 26 of the cell 11. The unloaded test head 15 passes through the maintenance opening 26 and is accommodated within the test head case 31. Further, an upper portion of the test head case 31 is also opened. Therefore, the operator can access the test head 15 accommodated in the test head case 31 through the open upper portion of the test head case 31 and replace a main board through this upper portion.

The test head case 31 is supported by the lifter 34 via a horizontal position adjusting stage 35. The horizontal position adjusting stage 35 includes a base 35a and a moving part 35b, which are as circular plate-shaped members and are vertically overlapped. Between the base 35a and the moving part 35b, multiple ball bearings (not illustrated) are arranged. Thus, the moving part 35b can be horizontally moved on the base 35a. The base 35a is connected with the lifter 34, and the moving part 35b is connected with the test head case 31. Therefore, the horizontal position adjusting stage 35 can move the test head case 31 horizontally with respect to the lifter 34.

Further, in the horizontal position adjusting stage 35, the moving part 35b can be fixed to the base 35a by engaging a part of the base 35a with a part of the moving part 35b by supplying air from the outside.

Since the moving part 35b is moved on the multiple ball bearings, great strength is not required to move the moving part 35b. As a result, the test head case 31 can be horizontally and easily moved by the operator. Further, a plate-shaped stopper 36 protrudes from a lower surface of the test head case 31 toward the lower side, and when a horizontal moving amount of the test head case 31 reaches a preset level, the stopper 36 is brought into contact with the base 35a of the horizontal position adjusting stage 35, so that the horizontal moving amount of the test head case 31 can be regulated.

At both upper portions of side surfaces of the test head case 31 in the longitudinal direction, there is provided a slide rail 37 formed of multiple balls. The slide rail 37 is configured to support the flange 17 of the test head 15 accommodated in the test head case 31, and the test head 15 is slid on the slide rail 37 in a longitudinal direction of the test head case 31.

Further, at both ends of the upper portions of the side surface of the test head case 31 in the longitudinal direction, there are provided stopper units 38 (fixing units). The stopper unit 38 includes a protrudable protrusion-shaped contactor 39, and when the contactor 39 protrudes to be brought into contact with the flange 17 of the test head 15, a position of the test head 15 is fixed with respect to the test head case 31. Further, in the lift device 30, when the test head 15 is accommodated in the test head case 31, if the contactor 39 is not brought into contact with the flange 17, the lifter 34 cannot be vertically moved.

When the test head 15 is slid in the longitudinal direction of the test head case 31, the operator may be at risk of getting his/her hand, particularly finger, caught between the flange 17 and the slide rail 37. Therefore, the slide rail 37 is covered with the slide rail cover 40.

In the maintenance carriage 27, the lift device 30 can fix a position of the test head case 31 at a height where the slide rail 37 of the test head case 31 directly faces the flange 17 of the test head 15 accommodated within a first-level cell 11, a height where the same slide rail 37 directly faces the flange 17 of the test head 15 accommodated within a second-level cell 11, a height where the same slide rail 37 directly faces the flange 17 of the test head 15 accommodated within a third-level cell 11, and a height where the same slide rail 37 directly faces the flange 17 of the test head 15 accommodated within a fourth-level cell 11.

Returning to FIG. 1, a guide rail 41 is provided at a lower portion of the outside of the cell tower 12. The guide rail 41 is provided along the longitudinal direction of the cell tower 12 and has a tube-shaped body having a rectangular cross section. At a side wall 41a of the guide rail 41 which is opposite to the cell tower 12, a slit 42 is formed. As depicted in FIG. 3B, the maintenance carriage 27 includes guide units 43 provided at the carriage base 29.

Figure 5:
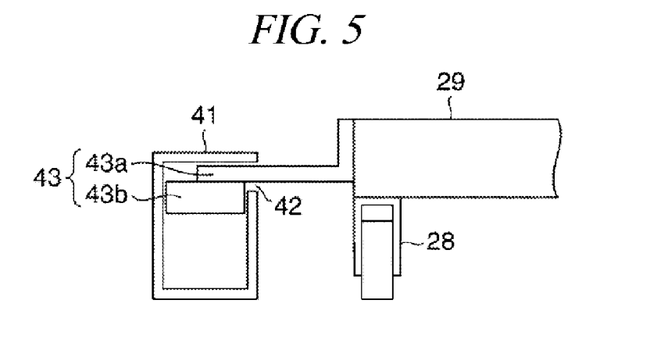
FIG. 5 is a partially enlarged view showing a movable fit between a guide unit and a guide rail.

As depicted in FIG. 5, the guide unit 43 includes a bracket 43a protruding from the carriage base 29 toward an outside thereof; and a roller 43b provided at a front end of the bracket 43a and configured to be horizontally rotated. The bracket 43a enters into the guide rail 41 through the slit 42 of the guide rail 41, and the roller 43b is accommodated within the guide rail 41. That is, the guide unit 43 is in the movable fit with the guide rail 41, and in this case, the side wall 41a of the guide rail 41 is positioned between the roller 43b and the carriage base 29.

The above-described maintenance carriage 27 is used to unload the entire of the test head 15. In performing the maintenance of the test head 15, there may be no need to unload the entire of the test head 15. In this case, a simple maintenance carriage 44 configured to mount a part of the test head 15 may be used instead of the maintenance carriage 27 in the wafer inspection apparatus 10.

Figure 6A:
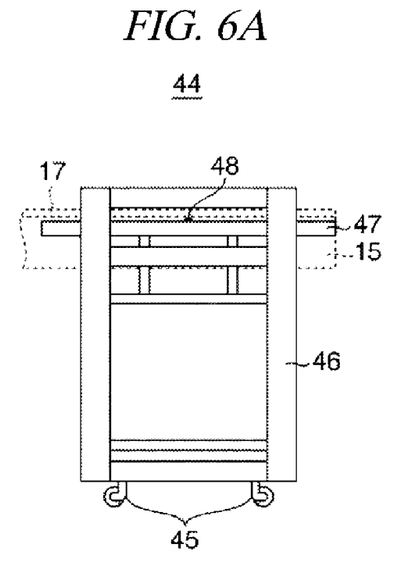
FIG. 6A illustrates a case where maintenance is conducted on a test head of a first-level cell in the cell tower.
Figure 6B:
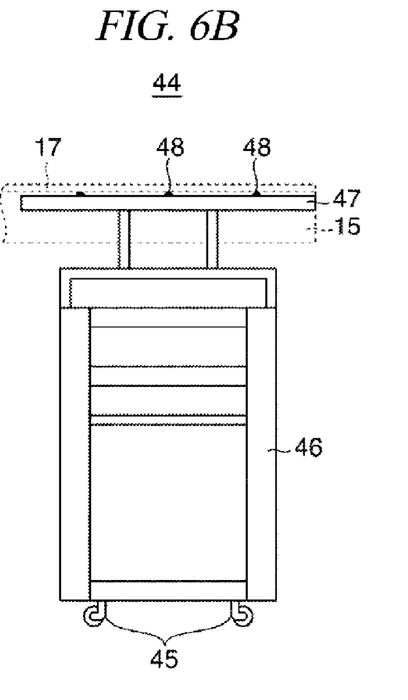
FIG. 6B illustrates a case where maintenance is conducted on a test head of a second-level cell in the cell tower.

FIG. 6A and FIG. 6B are side views schematically illustrating a configuration of a simple maintenance carriage, and to be specific, FIG. 6A illustrates a case where maintenance is conducted to a test head of a first-level cell in the cell tower, and FIG. 6B illustrates a case where maintenance is conducted to a test head of a second-level cell in the cell tower.

As depicted in FIG. 6A and FIG. 6B, the simple maintenance carriage 44 includes a main frame 46 having multiple rollers 45 at a bottom portion thereof; and a maintenance table 47 configured to be vertically moved with respect to the main frame 46. The maintenance table 47 includes a slide rail 48 formed of multiple balls, and the slide rail 48 is configured to support the flange 17 of the test head 15 of which a part is unloaded. The maintenance table 47 may be fixed at a first height where the slide rail 48 directly faces the flange 17 of the test head 15 accommodated within the first-level cell 11 and a second height where the slide rail 48 directly faces the flange 17 of the test head 15 accommodated within the second-level cell 11.

The simple maintenance carriage 44 is greatly simplified and lightweight as compared with the maintenance carriage 27, and also includes the multiple rollers 45 provided at the bottom portion of the main frame 46. Thus, the operator can easily adjust a position of the simple maintenance carriage 44, so that the slide rail 48 of the maintenance table 47 can accurately face the flange 17 of the test head 15 accommodated within the first-level or second-level cell 11. As a result, it is possible to unload a part of the test head 15 from the first-level or second-level cell 11.

Figure 7A:
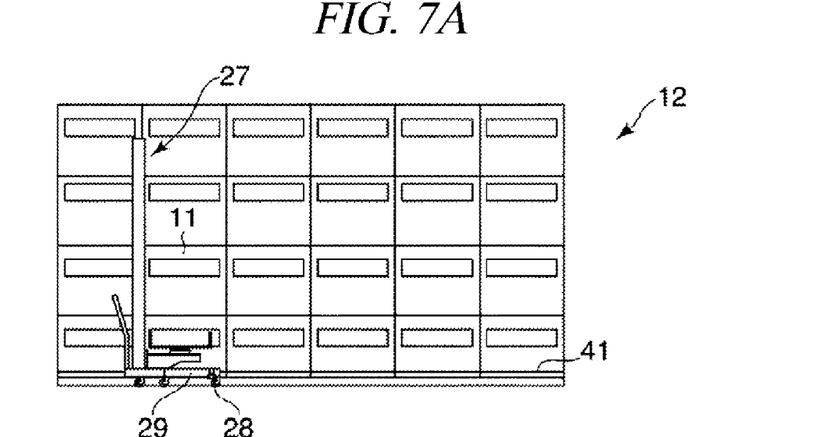
FIG. 7A to FIG. 7C are process diagrams for explaining a maintenance method for a wafer inspection apparatus with the maintenance carriage of FIG. 3A and FIG. 3B.
Figure 7B:
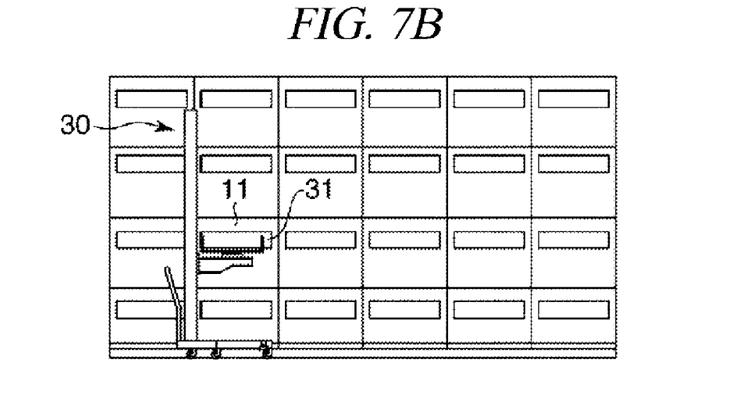
Figure 7C:
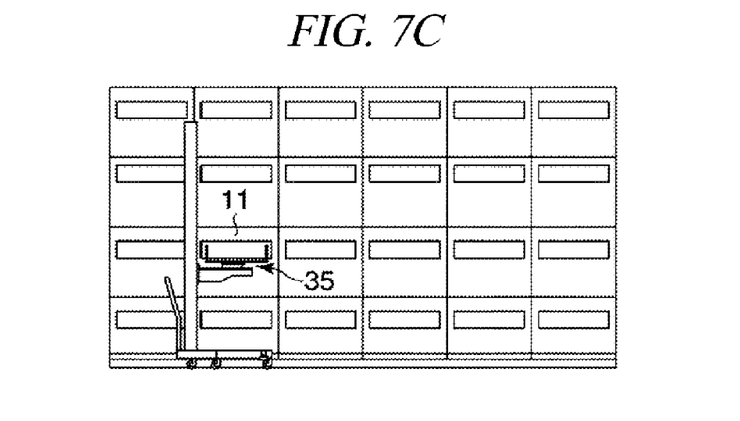

FIG. 7A to FIG. 7C are process diagrams for explaining a maintenance method for the wafer inspection apparatus with the maintenance carriage of FIG. 3A and FIG. 3B.

First, the rollers 43b of the guide units 43 are inserted within the guide rail 41 at the end portion of the guide rail 41. Then, while the rollers 43b are inserted within the guide rail 41, the maintenance carriage 27 is moved approximately to a position of the cell 11 accommodating the test head 15 to be maintained. Thereafter, by operating the brakes of the respective rollers 28 of the carriage base 29, the maintenance carriage 27 is fixed at the position (FIG. 7A).

Then, the lift device 30 raises the test head case 31 to a height where the slide rail 37 of the test head case 31 directly faces the flange 17 of the test head 15 to be maintained, and a position of the test head case 31 is fixed (FIG. 7B).

Thereafter, the position of the test head case 31 is fine controlled in the horizontal direction by the horizontal position adjusting stage 35 in order for the slide rail 37 to accurately face the flange 17 of the test head 15 to be maintained (FIG. 7C), and the present maintenance method is ended.

In the maintenance carriage 27 in accordance with the present example embodiment, the horizontal position adjusting stage 35 is provided between the lifter 34 of the lift device 30 arranged uprightly from the movable carriage base 29 and the test head case 31 configured to accommodate the test head 15, and the test head case 31 is horizontally moved with respect to the lifter 34 through the horizontal position adjusting stage 35. Accordingly, the position of the carriage base 29 is first fixed. Then, the test head case 31 is moved up to the position of the test head 15 to be maintained, and the position of the test head case 31 is fixed. Thereafter, the position of the test head case 31 can be fine controlled in the horizontal direction such that the slide rail 37 can accurately face the flange 17 of the test head 15 to be maintained. As a result, it is possible to easily unload the test head 15 toward the test head case 31.

In the above-described maintenance carriage 27, at the upper portions of the side surfaces of the test head case 31 in the longitudinal direction, there is provided the slide rail 37 on which the test head 15 is slid in the longitudinal direction of the test head case 31. Further, the slide rail 37 includes the stopper units 38 configured to fix the position of the test head 15. Thus, the test head 15 accommodated within the test head case 31 can be moved to a desired position within the test head case 31 and fixed at the position. Therefore, it is possible to improve maintenance efficiency of the test head 15.

Further, the above-described maintenance carriage 27 further includes the guide unit 43 which is in the movable fit with the guide rail 41 provided at the lower side of the cell tower 12. Thus, the maintenance carriage 27 can be accurately moved along the cell tower 12. Therefore, it is possible to reduce a time for adjusting the position of the maintenance carriage 27.

Furthermore, in the above-described maintenance carriage 27, the side wall 41a of the guide rail 41 is positioned between the carriage base 29 and the roller 43b provided at the front end of the bracket 43a protruding from the carriage base 29 toward the side direction thereof. Thus, even if the maintenance carriage 27 is tilted, since the roller 43b is engaged with the side wall 41a of the guide rail 41, the maintenance carriage 27 can be suppressed from turning over.

Although the present disclosure has been explained with reference to the above example embodiments, the present disclosure is not limited thereto.

Figure 8:
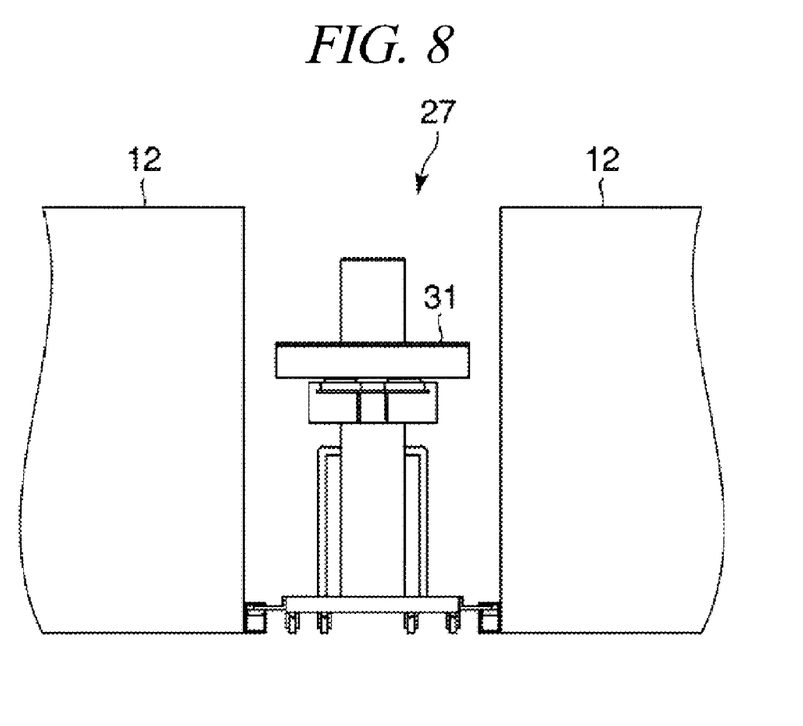
FIG. 8 is a front view illustrating a modification example of arrangement of the maintenance carriage of FIG. 3A and FIG. 3B.

By way of example, the above-described maintenance carriage 27 is provided only at the outside of the single cell tower 12. However, as depicted in FIG. 8, two cell towers 12 may be arranged such that outsides thereof face each other, and the maintenance carriage 27 may be provided between the two cell towers 12. In this case, the test head case 31 of the maintenance carriage 27 has the openings at both ends in the longitudinal direction, and each opening faces the maintenance opening 26 of each cell 11 of the wafer inspection apparatus 10. Thus, all of the test heads 15 of the wafer inspection apparatus 10 can be accommodated within the test head case 31. Therefore, it is possible to improve maintenance efficiency of the test head 15.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A wafer inspection system comprising:
   a transfer region in which a transfer device is arranged;
   an inspection region in which test heads for inspecting a substrate are arranged; and
   a maintenance region in which the test heads are maintained,
   wherein the inspection region is located between the transfer region and the maintenance region, a plurality of inspection rooms accommodating the test heads are adjacent to each other in the inspection region,
a slide rail is provided along a longitudinal direction of at least one of the test heads within a corresponding inspection room to support the at least one test head,
each of the plurality of inspection rooms has an opening facing the maintenance region, and
of the at least one test head is configured to be unloaded in the longitudinal direction by the slide rail from the inspection region to the maintenance region through the opening of the corresponding inspection room.

2. The wafer inspection system of claim 1,
wherein a maintenance carriage which is movable and is configured to support the unloaded test heads is arranged in the maintenance region.

3. The wafer inspection system of claim 2,
wherein the maintenance carriage is configured to accommodate the test heads and has a case which is movable up and down, and
the case is allowed to directly face one of the inspection rooms by moving the maintenance carriage and by moving the case up and down.

4. The wafer inspection system of claim 2,
wherein a position of the maintenance carriage and a position of the case are configured to be fixed.

5. The wafer inspection system of claim 2,
wherein a guide rail configured to control a moving direction of the maintenance carriage is arranged in the inspection region.

6. A wafer inspection apparatus comprising:
a plurality of inspection rooms accommodating test heads for inspecting a substrate on which a semiconductor device is formed and having a slide rail, along a longitudinal direction of the test heads within each of the plurality of inspection rooms, for supporting the test heads and unloading the test heads to a maintenance region; and
a loader configured to transfer the substrate into one of the inspection rooms,
wherein the plurality of inspection rooms are arranged at a cell tower between the loader and the maintenance region,
each of the plurality of inspection rooms has an opening facing the maintenance region,
one of the test heads is configured to be unloaded in the longitudinal direction by the slide rail from one of the inspection rooms to the maintenance region through the opening of each of the inspection rooms, and
the loader and the maintenance region are arranged at opposite sides of the cell tower.

7. A wafer inspection apparatus comprising:
a plurality of inspection rooms accommodating test heads for inspecting a substrate on which a semiconductor device is formed and having a slide rail, along a longitudinal direction of the test heads within each of the plurality of inspection rooms, for supporting the test heads and unloading the test heads to a maintenance region; and
a loader configured to transfer the substrate into one of the inspection rooms,
wherein the plurality of inspection rooms are arranged between the loader and the maintenance region,
each of the plurality of inspection rooms has an opening facing the maintenance region,
one of the test heads is configured to be unloaded in the longitudinal direction by the slide rail from one of the inspection rooms to the maintenance region through the opening of each of the inspection rooms, and
the loader and the maintenance region are facing each other across the plurality of inspection rooms.

* * * * *